(12) United States Patent
Ning et al.

(10) Patent No.: US 9,541,790 B2
(45) Date of Patent: Jan. 10, 2017

(54) DIRECT-TYPE BACKLIGHT MODULE AND MANUFACTURING METHOD THEREOF

(71) Applicant: Shenzhen China Star Optoelectronics Technology Co., Ltd., Shenzhen, Guangdong (CN)

(72) Inventors: Chao Ning, Guangdong (CN); Yongyuan Qiu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 182 days.

(21) Appl. No.: 14/399,163

(22) PCT Filed: Oct. 17, 2014

(86) PCT No.: PCT/CN2014/088843
§ 371 (c)(1),
(2) Date: Nov. 6, 2014

(87) PCT Pub. No.: WO2016/054838
PCT Pub. Date: Apr. 14, 2016

(65) Prior Publication Data
US 2016/0103363 A1    Apr. 14, 2016

(30) Foreign Application Priority Data

Oct. 10, 2014  (CN) .......................... 2014 1 0531196

(51) Int. Cl.
*G02F 1/1335* (2006.01)
*H01L 33/50* (2010.01)
(Continued)

(52) U.S. Cl.
CPC ... *G02F 1/133603* (2013.01); *G02F 1/133605* (2013.01); *G02F 1/133606* (2013.01);
(Continued)

(58) Field of Classification Search
CPC .................... H01L 33/56; H01L 33/502; G02F 2001/133614
See application file for complete search history.

(56) References Cited

U.S. PATENT DOCUMENTS

| 2010/0123855 A1* | 5/2010 | Shin ................. G02F 1/133617 349/61 |
| 2013/0240915 A1* | 9/2013 | Nakagawa ............ H01L 33/501 257/88 |
| 2014/0301065 A1 | 10/2014 | Jeong et al. |

FOREIGN PATENT DOCUMENTS

| CN | 102392955 A | 3/2012 |
| CN | 102709453 A | 10/2012 |

(Continued)

*Primary Examiner* — Elmito Breval
(74) *Attorney, Agent, or Firm* — Andrew C. Cheng

(57) ABSTRACT

A direct-type backlight module and a manufacturing method thereof are provided. The direct-type backlight module includes: a rear plate and a backlight source installed therein. The backlight source includes a LED light bar including LEDs. The LEDs have a phosphor layer disposed thereon. The phosphor layer and the LEDs have a colloid material layer sandwiched therebetween for thermal isolation. The present invention disposes the colloid material layer so as to avoid heat generated by the LEDs to be directly transferred to the phosphor layer to cause efficiency reduction, meanwhile there is no need of a large amount of phosphor layer to fabricate a large-sized film sheet and thus the material usage of the phosphor layer is reduced. The present invention can effectively use the phosphor layer to improve color saturation of display while ensuring the efficient use of LED brightness and the life span by the colloid material layer.

17 Claims, 3 Drawing Sheets

(51) Int. Cl.
*H01L 33/56* (2010.01)
*H01L 25/075* (2006.01)
(52) U.S. Cl.
CPC ............ *H01L 33/502* (2013.01); *H01L 33/56* (2013.01); *G02F 2001/133614* (2013.01); *G02F 2001/133628* (2013.01); *H01L 25/0753* (2013.01); *H01L 2924/0002* (2013.01); *H01L 2933/005* (2013.01); *H01L 2933/0041* (2013.01)

(56) References Cited

FOREIGN PATENT DOCUMENTS

| CN | 102709454 A | 10/2012 |
| CN | 103280516 A | 9/2013 |
| CN | 103887406 A | 6/2014 |

\* cited by examiner

DIRECT-TYPE BACKLIGHT MODULE AND MANUFACTURING METHOD THEREOF

TECHNICAL FIELD

The present invention relates to the field of liquid crystal display technology, and particularly to a direct-type backlight module and a manufacturing method of the direct-type backlight module.

DESCRIPTION OF RELATED ART

In the technical field of display, owing to the rapid development of OLED (Organic Light-Emitting Diode) technology, the LCD (Liquid Crystal Display) is confronted with numerous challenges, compared with the OLED, the LCD have disadvantages on the aspects of thinness, being curved, color saturation and so on. In order to make the LCD to rival the OLED on the above aspects, people give a growing emphasis of overcoming technical difficulties on these aspects.

For example, on the aspect of color saturation, the CF (Color Filter) is adjusted or a LED light source with high color saturation (such as a LED containing red and green phosphors, or a LED with multi-color chips, even using quantum dots as the form of phosphor) is adopted, so as to achieve the high color saturation of LCD, so that the NTSC (color saturation) is up to 90% and thereby the high color saturation is realized.

For the principle of speaking, the method of realizing high saturation is to expand an area of a triangle formed by color points of pure colors (R, G, B) of LCD in the CIE diagram as much as possible, so as to achieve a larger NTSC area, as shown in FIG. 1. However, since RGB chips (multi-chip) use different semiconductor materials, which results in different photoelectric characteristics and different lifespan.

Accordingly, when the requirement of lifespan is considered, the drive design is confronted with a great challenge. A current mainstream design of high saturation is using a blue LED cooperative with red and green phosphors. As seen from FIG. 1, in order to expand the color gamut triangle (as denoted by the dashed line in FIG. 1), the narrower of a half peak width of phosphor spectrum is the better. The nitride or silicate phosphor material mainly used in the prior art has a very high stability and is not susceptible to the influence of the external environment and thus is widely accepted. However, the half peak widths of the two kinds of phosphor materials are greater than 60 nanometers, which results in that the LCD NTSC being about 90% is the ultimate when uses such kinds of phosphors without changing the condition of LCD CF, and moreover the efficiency of red phosphor of the two kinds of materials is relatively low and thereby an overall brightness of LED is not high.

In order to further enhance the color saturation while ensuring the brightness of LED, materials with narrow half peak width and high efficiency are continuously proposed, for example quantum dot phosphors, sulfide or nitride phosphors. However, these kinds of phosphor materials have poor environmental stability and efficiencies thereof are rapidly decreased at high temperature conditions.

In addition, in the prior art (US20120050649A1), quantum dots are packaged in a tube and disposed between a light guide plat and a blue/UV LED light source; or the QBEF film developed by 3M company, cooperative with a backlight film sheet using a blue LED as light source, fabricates the phosphor into a film sheet structure and thus can be well isolated from the heat source, and meanwhile the phosphor can be treated as a film sheet (film glue material layer) for direct use when in assembly. However, in a large-sized display panel, the phosphor material used in the form of film inevitably leads to increased amount of the phosphor material, and therefore how to effectively improve the utilization of phosphor and reduce the usage amount of phosphor has become a direction of current research.

Therefore, while using these phosphor materials, how to improve the color saturation and ensure the efficient use of LED brightness and control the material cost of phosphor has become an important problem in the prior art desired to be solved.

SUMMARY

Accordingly, the present invention provides a direct-type backlight module and a manufacturing method thereof, which can improve the color saturation of display, ensure the efficient use of LED brightness and the lifespan, and control the material cost of phosphor.

In order to solve the above described technical problem, an embodiment of the present invention provides a direct-type backlight module. The direct-type backlight module includes: a rear plate and a backlight source installed in the rear plate. The backlight source includes a LED light bar. The LED light bar includes multiple (i.e., more than one) LEDs. The LEDs have a phosphor layer disposed thereon. The phosphor layer and the LEDs have a colloid material layer sandwiched therebetween for thermal isolation between the phosphor layer and the LEDs.

In an exemplary embodiment, a material of the phosphor layer is a quantum dot material, a sulfide, a fluoride, a nitride or a silicate.

In an exemplary embodiment, the phosphor layer is coated on the colloid material layer and cured, or is a phosphor film sheet.

In an exemplary embodiment, the colloid material layer is a silica gel or a resin material coated on the LEDs. The phosphor layer and the colloid material layer are alternately stacked and thereby each forming a multilayer.

In an exemplary embodiment, the direct-type backlight module further includes a diffusing plate. The phosphor layer and the colloid material layer are sandwiched between the diffusing plate and the LEDs, and a side of the colloid material layer adjacent to the diffusing layer is formed with a tapered recessed area and spaced from the diffusing plate to reflect a part of light from a side of the LEDs back to the phosphor layer.

In an exemplary embodiment, the direct-type backlight module further includes a reflective sheet. The LEDs are disposed between the colloid material layer and the reflective sheet and thereby light from the LEDs is reflected by the reflective sheet.

In an exemplary embodiment, a surface of the reflective sheet adjacent to the LEDs is coated with reflective dots and/or formed with reflective microstructures to convert a light into a wide-angle Gauss beam or Lambertian beam.

In order to solve the above technical problem, an embodiment of the present invention further provides a manufacturing method of a direct-type backlight module. The manufacturing method includes: forming LEDs on a rear plate; forming a colloid material layer on the LEDs, and a material of the colloid material layer being a silica gel or a resin material; and forming a phosphor layer on the colloid material layer and thereby thermal isolation between the phosphor layer and the LEDs is achieved. A material of the phosphor layer is a quantum dot material, a sulfide, a fluoride, a nitride or a silicate.

In an exemplary embodiment, in the step of forming a colloid material layer on the LEDs, concretely includes: coating the silica gel or the resin material on the LEDs and then performing a UV curing or heat curing. In the step of forming a phosphor layer on the colloid material layer, concretely includes: coating the material of the phosphor layer on the colloid material layer and curing.

In an exemplary embodiment, the colloid material layer and the phosphor layer are alternately stacked and thereby each forming a multilayer, and the outmost layer away from the LEDs is the colloid material layer. The manufacturing method further includes: forming a tapered recessed area on the outmost colloid material layer to reflect a part of light from a side of the LEDs back to the phosphor layer.

By the above technical solutions, efficacy of embodiments of the present invention are that: the present invention disposes the colloid material layer between the LEDs and the phosphor layer, which can avoid heat generated by the LEDs to be directly transferred to the phosphor layer to cause efficiency reduction; meanwhile, there is no use of a large amount of phosphor layer to fabricate a large-sized film sheet layer and thus the material usage of the phosphor layer is reduced. The present invention effectively uses the phosphor layer to improve the color saturation of display while ensures the efficient use of LED brightness and lifespan by the colloid material layer, and further can sharply reduce the material cost of phosphor.

BRIEF DESCRIPTION OF THE DRAWINGS

In order to more clearly illustrate the technical solutions of various embodiments of the present invention, drawings will be used in the description of embodiments will be given a brief description below. Apparently, the drawings in the following description only are some embodiments of the invention, the ordinary skill in the art can obtain other drawings according to these illustrated drawings without creative effort. In the drawings.

DETAILED DESCRIPTION OF EMBODIMENTS

In the following, with reference to accompanying drawings of embodiments of the present invention, technical solutions in the embodiments of the present invention will be clearly and completely described. Apparently, the embodiments of the present invention described below only are a part of embodiments of the present invention, but not all embodiments. Based on the described embodiments of the present invention, all other embodiments obtained by ordinary skill in the art without creative effort belong to the scope of protection of the present invention.

Figure 1:
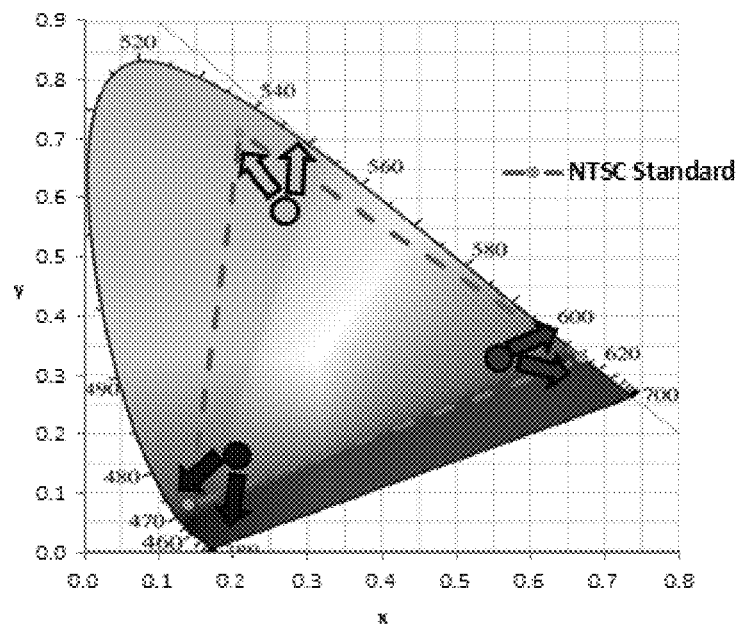
FIG. 1 is a schematic principle diagram of achieving high saturation in the conventional display technology, where the larger an area of a triangle formed by color points of pure colors (R, G, B) is, the better of NTSC performance is.
Figure 2:
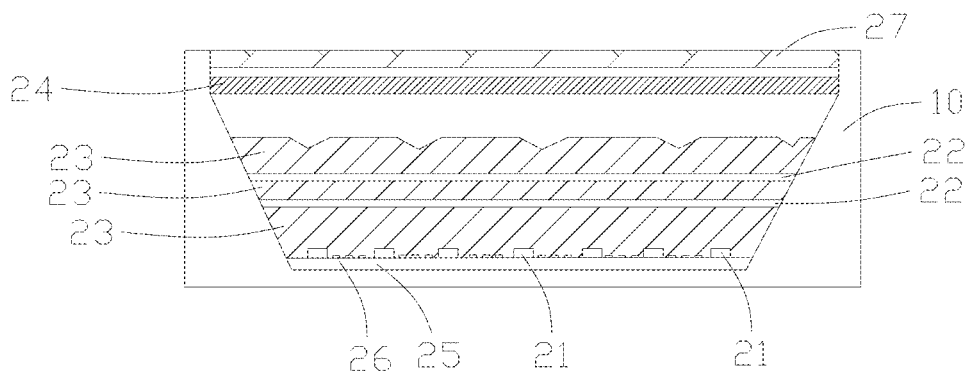
FIG. 2 is a schematic structural view of an embodiment of a direct-type backlight module according to the present invention.

Referring to FIG. 2, FIG. 2 is a schematic structural view of an embodiment of a direct-type backlight module according to the present invention. The direct-type backlight module in this embodiment includes but not limited to a rear plate 10, a backlight source (not shown), a phosphor layer 22, a colloid material layer 23, a diffusing plate 24 and a reflective sheet 25.

In this embodiment, the backlight source is installed in (e.g., housed in) the rear plate 10. The backlight source includes a LED light bar (not shown). The LED light bar includes multiple (i.e., more than one) LEDs 21. It is noted that, the LEDs 21 may be blue LEDs or LEDs with a shorter wavelength. The LEDs 21 may be LED lamps each with an encapsulation structure, or LED chips. When the LEDs 21 are LED chips, they can be fixed by using the conventional COB packaging technology or LED flip-chip bonding technology.

The phosphor layer 22 is disposed on the LEDs 21. A material of phosphor layer 22 is a quantum dot material, a sulfide, a fluoride, a nitride or a silicate.

It is noted that, the phosphor layer 22 in this embodiment may be formed by directly coating one or multiple of the above listed materials and then curing, for example, is formed by coating the quantum dot material, or the phosphor layer 22 may be a phosphor film sheet prepared in advance, and it is not limited herein.

The colloid material layer 23 is sandwiched between the phosphor layer 22 and the LEDs 21 for thermal isolation between the phosphor layer 22 and the LEDs 21. It is noted that, in this embodiment, the colloid material layer 23 may be a silica gel or a resin material coated on the LEDs 21.

Concretely speaking, the colloid material layer 23 in this embodiment is directly coated on the LEDs 21, and the phosphor layer 22 is coated on the colloid material layer 23 and cured. Moreover, the colloid material layer 23 and the phosphor layer 22 are alternately stacked and thereby each forming a multilayer. As shown in FIG. 2, in this embodiment, the colloid material layer 23 has three layers, and the phosphor layer 22 is sandwiched between each two adjacent colloid material layers 23 and has two layers. It is noted that, in order to achieve better fluorescent effect and conduction effect, other number of layers can be set instead, and they are not limited herein.

It is easily found that, the embodiment of the present invention disposes the colloid material layer 23 between the LEDs 21 and the phosphor layer 22, which can avoid heat generated by the LEDs 21 to be directly transferred to the phosphor layer 22 to cause efficiency reduction; meanwhile, there is no use of a large amount of phosphor layer 22 to fabricate a large-sized film sheet layer and thus the material usage of the phosphor layer 22 is reduced. The embodiment of the present invention effectively uses the phosphor layer 22 to improve the color saturation of display while ensures the efficient use of LED brightness and lifespan by the colloid material layer 23, and further can sharply reduce the material cost of phosphor.

Figure 3:
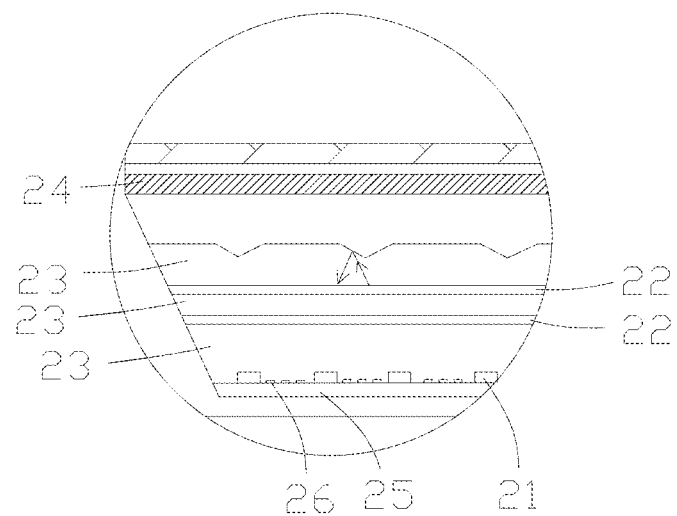
FIG. 3 is a schematic structural view of a side of a colloid material layer adjacent to a diffusing plate in the direct-type backlight module as shown in FIG. 2, where the light path principle is shown.

Moreover, as shown in FIG. 3, the phosphor layer 22 and the colloid material layer 23 are sandwiched between the diffusing plate 24 and the LEDs 21. A side of the colloid material layer 23 adjacent to the diffusing plate 24 is formed with a tapered recessed area and spaced from the diffusing plate 24, so as to reflect a part of light from a side of the LEDs 21 back to the phosphor layer 22. It is noted that, the tapered recessed area may be conical or other multi-faceted regular taper such as a triangular pyramid or a quadrangular pyramid, and it is not limited herein.

It is easily understood that, since the presence of an interface between the colloid material layer and air (gap between the diffusing plate 24 and the colloid material layer 23), and a refractive index of the colloid material layer 23 is about 1.5, total reflection would occur on light rays with light emergence angles larger than 42°, and the light rays pass through the phosphor layer 22 once again and thereby achieving the full use of the phosphor layer 22. For example, as to an inverted cone structure formed on the outmost colloid material layer 23, by setting an angle of slope, which can well reduce the amount of light directly emitted from the colloid material layer 23 toward the diffusing plate 24, and therefore can achieve better fluorescent effect and improve the backlight quality while the structure of the direct-type display apparatus is designed to be thin.

Figure 4:
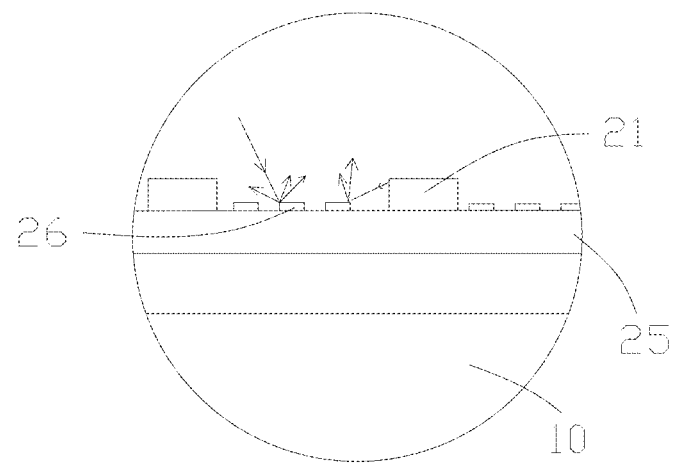
FIG. 4 is a schematic structural view of reflective dots 26 and/or reflective microstructures 26 in the direct-type backlight module as shown in FIG. 2, where the light path principle is shown.

In addition, as shown in FIG. 4, the LEDs 21 are disposed between the colloid material layer 23 and the reflective sheet 25 and thereby the reflective sheet 25 reflects light from the LEDs 21. Moreover, a surface of the reflective sheet 25 adjacent to the LEDs 21 is coated with or formed with reflective structures 26, so as to convert a light into a wide-angle Gauss beam or Lambertian beam.

It is noted that, FIG. 4 illustrates regular reflective structures 26. However, in actual products, in order to increase the technical effect of uniform scattering, the reflective structures 26 in this embodiment concretely may be reflective dots or reflective microstructures, and may be regular or irregular, so as to achieve the uniform distribution of light and thereby improve the uniform effect of backlight.

It is noted that, this embodiment may further include an optical film 27 disposed at the side of a light emergence surface of the diffusing plate 24, or a plastic frame for fixing the above structures, and so on. Within the scope of the skilled person in the art will readily understand, detailed description thereof will not be made herein.

Figure 5:
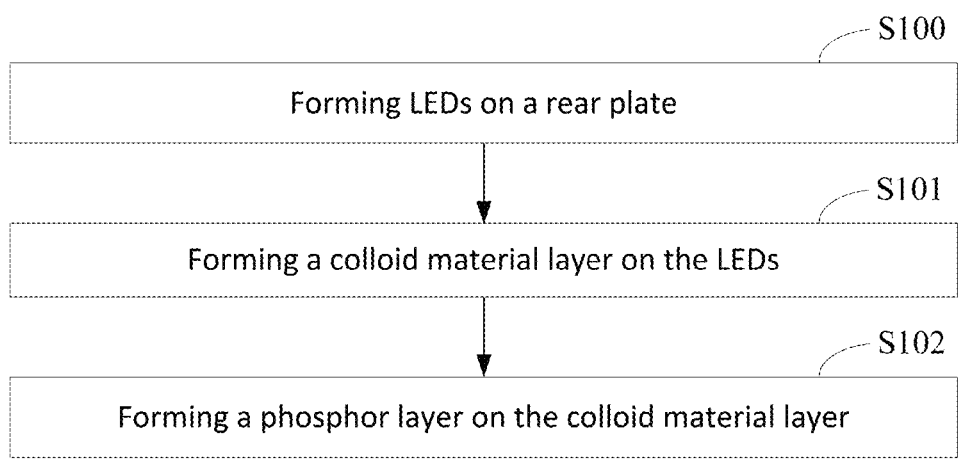
FIG. 5 is a flowchart of an embodiment of a manufacturing method of a direct-type backlight module according to the present invention.

Referring to FIG. 5, another embodiment of the present invention provides a manufacturing method of a direct-type backlight module. The manufacturing method may include the following steps.

Step S100: forming LEDs on a rear plate.

In the step S100, the LEDs can be fabricated by molding. In a preferred embodiment, before the step S100, a reflective sheet is firstly formed on the rear plate and the reflective sheet is formed with reflective structures to increase the uniform effect of light. Concretely speaking, reflective dots or reflective microstructures may be formed on the reflective sheet and may be regular or irregular, so as to achieve the uniform distribution of light and thereby improve the uniform effect of backlight.

Step S101: forming a colloid material layer on the LEDs.

In the step S101, a material of the colloid material layer is a silica gel or a resin material. As previously mentioned, in this embodiment, the silica gel or resin material may be directly coated on the LEDs and then is UV cured or heat cured. In this embodiment, it can be heated up to 75° C., 80° C. or 85° C. for curing, so as to obtain better curing effect and the resultant structure is more stable. Moreover, the manner of the colloid material layer being directly coated on the LEDs can effectively improve the light emergence effect of LEDs.

Step S102: forming a phosphor layer on the colloid material layer.

In the step S102, a material of the phosphor layer is a quantum dot material, a sulfide, a fluoride, a nitride, or a silicate. Concretely speaking, in this embodiment, the material of the phosphor layer can be coated on the colloid material layer and then cured, for example is heated up to 75° C., 80° C. or 85° C. for curing, so as to obtain better curing effect and the resultant structure is more stable.

As previously mentioned, the colloid material layer and the phosphor layer in this embodiment of the present invention can be alternately stacked and thereby each forming a multilayer, and the outmost layer away from the LEDs is the colloid material layer. Meanwhile, in this embodiment, the outmost colloid material layer may be formed with a tapered recessed area so as to reflect a part of light from a side of the LEDs back to the phosphor layer.

In addition, other step process of the manufacturing method of the embodiment of the present invention can refer to the related description associated with the foregoing embodiments, by the manufacturing method of this embodiment, any one of the foregoing structures and combinations thereof can be manufactured. Within the scope of the skilled person in the art will readily understand, detailed description thereof will not be made herein.

In summary, the embodiments of the present invention dispose the colloid material layer between the LEDs and the phosphor layer, which can avoid heat generated by the LEDs to be directly transferred to the phosphor to cause efficiency reduction, and meanwhile, there is no use of a large amount of phosphor layer to fabricate a large-sized film sheet layer and thus the material usage of phosphor layer is reduced. The embodiments of the present invention effectively use the phosphor layer to improve the color saturation of display while ensures the efficient use of LED brightness and lifespan by the colloid material layer, and further can sharply reduce the material cost of phosphor.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A direct-type backlight module, comprising: a rear plate and a backlight source installed in the rear plate; wherein the backlight source comprises a LED light bar, the LED light bar comprises a plurality of LEDs; the direct-type backlight module further comprises a continuous colloid material layer and a continuous phosphor layer alternately stacked on the plurality of LEDs along a direction facing away from the plurality of LEDs to form a stacked multilayer structure, the two outmost layers of the stacked multilayer structure each are the continuous colloid material layer, one of the two outmost layers being the continuous colloid material layer is in contact with the plurality of LEDs while the other one of the two outmost layers being the continuous colloid material layer is located at a side of the stacked multilayer structure far away from the plurality of LEDs, and all the continuous phosphor layer(s) in the stacked multilayer structure is/are located between the two outmost layers; a material of the continuous phosphor layer is a quantum dot material, a sulfide, a fluoride, a nitride or a silicate, the continuous colloid material layer is a silica gel or a resin material.

2. A direct-type backlight module comprising: a rear plate and a backlight source disposed in the rear plate; the backlight source comprises a LED light bar, the LED light bar comprises a plurality of LEDs; the direct-type backlight module further comprises a continuous colloid material layer and a continuous phosphor layer alternately stacked on the plurality of LEDs along a direction facing away from the plurality of LEDs to form a stacked multilayer structure, the two outmost layers of the stacked multilayer structure each are the continuous colloid material layer, a first one of the two outmost layers being the continuous colloid material layer is in contact with the plurality of LEDs while a second one of the two outmost layers being the continuous colloid material layer is located at a side of the stacked multilayer structure far away from the plurality of LEDs, and all the continuous phosphor layer(s) in the stacked multilayer structure is/are located between the two outmost layers.

3. The direct-type backlight module according to claim 2, wherein a material of the continuous phosphor layer is a quantum dot material, a sulfide, a fluoride, a nitride or a silicate.

4. The direct-type backlight module according to claim 3, wherein the continuous phosphor layer is coated on the corresponding continuous colloid material layer and cured, or the continuous phosphor layer is a phosphor film sheet.

5. The direct-type backlight module according to claim 4, wherein the continuous colloid material layer is a silica gel or a resin material.

6. The direct-type backlight module according to claim 5, wherein the direct-type backlight module further comprises a diffusing plate, the stacked multilayer structure is sandwiched between the diffusing plate and the plurality LEDs, a side of the second one of the two outmost layers being the continuous colloid material layer adjacent to the diffusing plate is formed with a tapered recessed area and spaced from the diffusing layer to reflect a part of light from a side of the plurality of LEDs back to the phosphor layer.

7. The direct-type backlight module according to claim 5, wherein the direct-type backlight module further comprises a reflective sheet, the plurality of LEDs are disposed between the first one of the two outmost layers being the continuous colloid material layer and the reflective sheet and thereby the reflective sheet reflects light from the plurality of LEDs.

8. The direct-type backlight module according to claim 7, wherein a surface of the reflective sheet adjacent to the plurality of LEDs is coated with reflective dots and/or formed with reflective microstructures to convert a light into a wide-angle Gaussian beam or Lambertian beam.

9. The direct-type backlight module according to claim 2, wherein the continuous colloid material layer is a silica gel or a resin material.

10. The direct-type backlight module according to claim 9, wherein the direct-type backlight module further comprises a diffusing plate, the stacked multilayer structure is sandwiched between the diffusing plate and the plurality of LEDs, a side of the second one of the two outmost layers being the continuous colloid material layer adjacent to the diffusing plate is formed with a tapered recessed area and spaced from the diffusing layer to reflect a part of light from a side of the plurality of LEDs back to the phosphor layer.

11. The direct-type backlight module according to claim 9, wherein the direct-type backlight module further comprises a reflective sheet, the plurality of LEDs are disposed between the first one of the two outmost layers being the continuous colloid material layer and the reflective sheet and thereby the reflective sheet reflects light from the plurality of LEDs.

12. The direct-type backlight module according to claim 11, wherein a surface of the reflective sheet adjacent to the plurality of LEDs is coated with reflective dots and/or formed with reflective microstructures to convert a light into a wide-angle Gaussian beam or Lambertian beam.

13. The direct-type backlight module according to claim 11, wherein a surface of the reflective sheet adjacent to the plurality of LEDs is coated with reflective dots and/or formed with reflective microstructures to convert a light into a wide-angle Gaussian beam or Lambertian beam.

14. A manufacturing method of a direct-type backlight module, comprising:
  forming LEDs on a rear plate; and
  alternately forming a continuous colloid material layer and a continuous phosphor layer on the LEDs along a direction facing away from the LEDs to form a stacked multilayer structure;
  wherein the two outmost layers of the stacked multilayer structure each are the continuous colloid material layer, a first one of the two outmost layers being the continuous colloid material layer is in contact with the LEDs while a second one of the two outmost layers being the continuous colloid material layer is located at a side of the stacked multilayer structure far away from the LEDs, and all the continuous phosphor layer(s) in the stacked multilayer structure is/are located between the two outmost layers;
  wherein a material of the continuous colloid material layer is a silica gel or a resin material;
  wherein a material of the continuous phosphor layer is a quantum dot material, a sulfide, a fluoride, a nitride or a silicate.

15. The manufacturing method according to claim 14, wherein:
  the step of alternately forming a continuous colloid material layer and a continuous phosphor layer on the LEDs along a direction facing away from the LEDs to form a stacked multilayer structure comprises:
  coating the silica gel or the resin material on the LEDs and then performing UV curing or heat curing; and
  coating the material of the continuous phosphor layer on the corresponding continuous colloid material layer and then curing.

16. The manufacturing method according to claim 14, further comprising:
  forming a tapered recessed area on a side of the second one of the two outmost layers being the continuous colloid material layer facing away from the LEDs to reflect a part of light from a side of the LEDs back to the continuous phosphor layer.

17. The manufacturing method according to claim 15, further comprising:
  forming a tapered recessed area on a side of the second one of the two outmost layers being the continuous colloid material layer facing away from the LEDs to reflect a part of light from a side of the LEDs back to the continuous phosphor layer.

* * * * *